United States Patent
Kang

(10) Patent No.: US 7,072,203 B2
(45) Date of Patent: Jul. 4, 2006

(54) HYBRID SWITCH CELL AND MEMORY DEVICE USING THE SAME

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 14 days.

(21) Appl. No.: 10/876,486

(22) Filed: Jun. 28, 2004

(65) Prior Publication Data

US 2005/0128781 A1    Jun. 16, 2005

(30) Foreign Application Priority Data

Dec. 10, 2003  (KR) .................. 10-2003-0089564

(51) Int. Cl.
*G11C 11/22*  (2006.01)

(52) U.S. Cl. ...................... 365/145; 365/129
(58) Field of Classification Search ................ 365/145, 365/129
See application file for complete search history.

(56) References Cited

U.S. PATENT DOCUMENTS

| | | | |
|---|---|---|---|
| 5,936,832 A * | 8/1999 | Saito et al. ............... | 361/321.4 |
| 5,959,878 A * | 9/1999 | Kamp ......................... | 365/117 |
| 6,272,594 B1 | 8/2001 | Gupta et al. | |
| 6,363,439 B1 | 3/2002 | Battles et al. | |
| 6,370,058 B1 * | 4/2002 | Fukumoto ............... | 365/185.08 |
| 6,781,866 B1 * | 8/2004 | Ashikaga ..................... | 365/145 |
| 6,870,761 B1 * | 3/2005 | Johnson ....................... | 365/158 |
| 6,873,537 B1 * | 3/2005 | Kang ......................... | 365/145 |
| 2003/0103372 A1 * | 6/2003 | Matsushita .................. | 365/145 |

FOREIGN PATENT DOCUMENTS

| | | |
|---|---|---|
| KR | 2001-0057275 A | 3/2003 |
| KR | 10-2003-173673 | 6/2003 |

* cited by examiner

*Primary Examiner*—Michael Tran
(74) *Attorney, Agent, or Firm*—Heller Ehrman LLP

(57) ABSTRACT

A nonvolatile memory device features a hybrid switch cell as a cross-point cell using a nonvolatile ferroelectric capacitor and a hybrid switch. The hybrid switch cell comprises a ferroelectric capacitor and a hybrid switch. The ferroelectric capacitor, located where a word line and a bit line are crossed, stores values of logic data. The hybrid switch is connected between the ferroelectric capacitor and the bit line and selectively switched depending on voltages applied to the word line. The nonvolatile memory device using a hybrid switch cell comprises a plurality of hybrid switch cell arrays, a plurality of word line driving units and a plurality of sense amplifiers. Each of the plurality of hybrid switch cell arrays each includes a single hybrid switch cell where a word line and a bit line are crossed. The plurality of word line driving units selectively drive the word line. The plurality of sense amplifiers sense and amplify data transmitted through the bit line.

20 Claims, 13 Drawing Sheets

HYBRID SWITCH CELL AND MEMORY DEVICE USING THE SAME

BACKGROUND OF THE INVENTION

1. Field of the Invention

The present invention generally relates to a memory device, and more specifically, to a hybrid switch cell embodied as a cross-point cell using a nonvolatile ferroelectric capacitor and a hybrid switch, and a nonvolatile memory device using the hybrid switch cell to improve the whole size.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

The conventional FeRAM device comprises a switching device which is switched depending on a voltage of a word line and connects a nonvolatile ferroelectric capacitor to a sub bit line. The nonvolatile ferroelectric capacitor is connected to a terminal of the switching device and a plate line.

Meanwhile, in the conventional FeRAM, a NMOS transistor whose switching operation is controlled by a gate control signal is used as the switching device.

However, the above-described NMOS transistor requires an additional area for gate control when a cell array is embodied with a switching device, which results in increase of the whole chip size.

SUMMARY OF THE INVENTION

Accordingly, it is a first object of the present invention to reduce the whole size of a nonvolatile memory device by embodying a cross-point cell with a nonvolatile ferroelectric capacitor and a hybrid switch.

It is a second object of the present invention to improve operation characteristics of a memory cell by effectively driving read/write operations in a cell array using the hybrid switch.

In an embodiment, a hybrid switch cell comprises a nonvolatile ferroelectric capacitor and a hybrid switch. The nonvolatile ferroelectric capacitor, connected to a word line, stores a logic data value. The hybrid switch is connected between the nonvolatile ferroelectric capacitor and a bit line, and selectively switched depending on voltages applied to the word line and the bit line.

Preferably, the hybrid switch has a sequentially deposited structure of the bit line, the hybrid switch, the nonvolatile ferroelectric capacitor and the word line, and the nonvolatile ferroelectric capacitor and the hybrid switch are formed where the word line and the bit line are crossed.

In an embodiment, a memory device using a hybrid switch cell comprises a plurality of hybrid switch cell arrays, a plurality of word line driving units and a plurality of sense amplifiers. Each of the plurality of hybrid switch cell arrays comprises a plurality of hybrid switch cells each located where a word line and a bit line are crossed. The plurality of word line driving units selectively drive the word line. The plurality of sense amplifiers sense and amplify data transmitted through the bit line. The memory device further comprises a data bus, a main amplifier, a data buffer and an input/output port. The data bus is shared by the plurality of sense amplifiers. The main amplifier amplifies data of the data bus. The data buffer buffers data inputted/outputted in the main amplifier. The input/output port, connected to the data buffer, inputs/outputs data.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
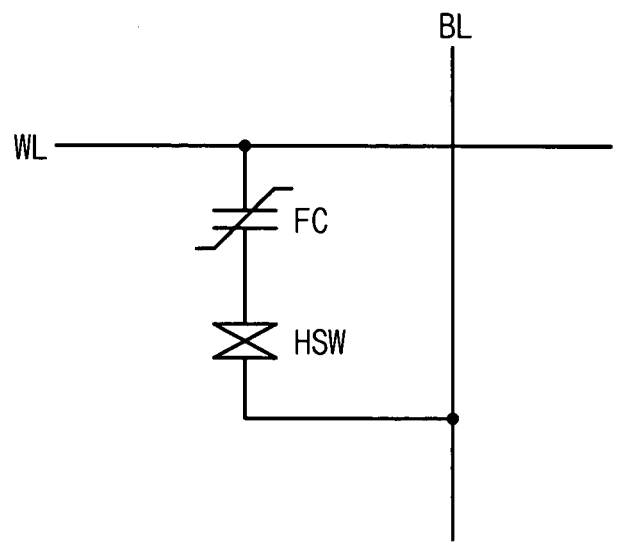
FIG. 1 is a circuit diagram of a hybrid switch cell according to an embodiment of the present invention.

FIG. 1 is a circuit diagram of a hybrid switch cell according to an embodiment of the present invention.

A hybrid switch cell comprises a nonvolatile ferroelectric capacitor FC and a hybrid switch HSW which are connected serially. Here, the hybrid switch HSW is connected between one electrode of the nonvolatile ferroelectric capacitor FC and a bit line BL. The other electrode of the nonvolatile ferroelectric capacitor FC is connected to a word line WL.

Figure 2:
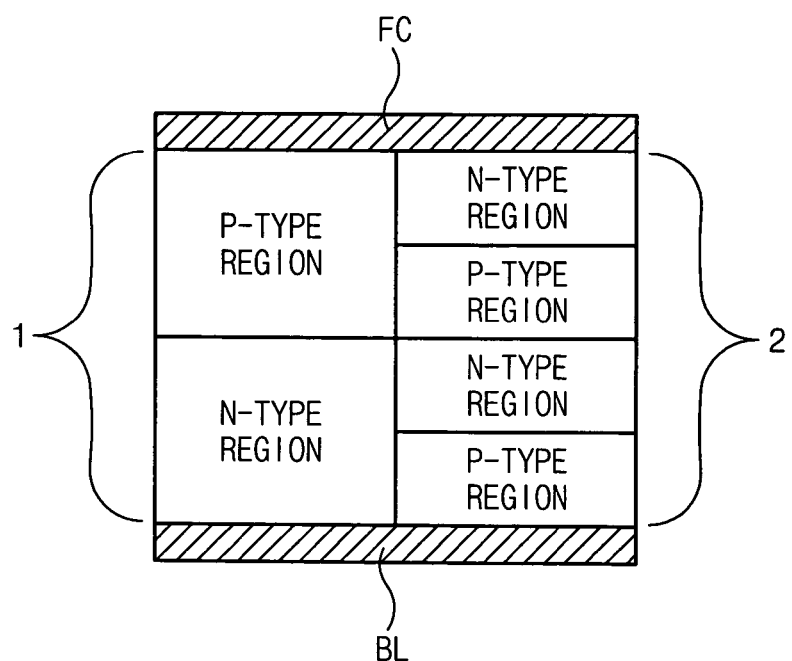
FIG. 2 is a cross-sectional diagram of a hybrid switch of FIG. 1.

FIG. 2 is a cross-sectional diagram of the hybrid switch HSW of FIG. 1.

The hybrid switch HSW comprises a PN diode switch 1 and a PNPN diode switch 2 which are connected in parallel between the nonvolatile ferroelectric capacitor FC and the bit line BL.

In the PN diode switch 1, a P-type region is deposited on a N-type region. The P-type region of the PN diode switch 1 is connected to one electrode of the nonvolatile ferroelectric capacitor FC, and the N-type region of the PN diode switch 1 is connected to one electrode of the bit line BL.

In the PNPN diode switch 2, a P-type region, a N-type region, a P-type region and a N-type region are sequentially deposited. The upper N-type region of the PNPN diode switch 2 is connected to one electrode of the nonvolatile ferroelectric capacitor FC, and the lower P-type region of the PNPN diode switch 2 is connected to the bit line BL.

The above-described hybrid switch HSW is represented by a symbol as shown in FIG. 1.

Figure 3:
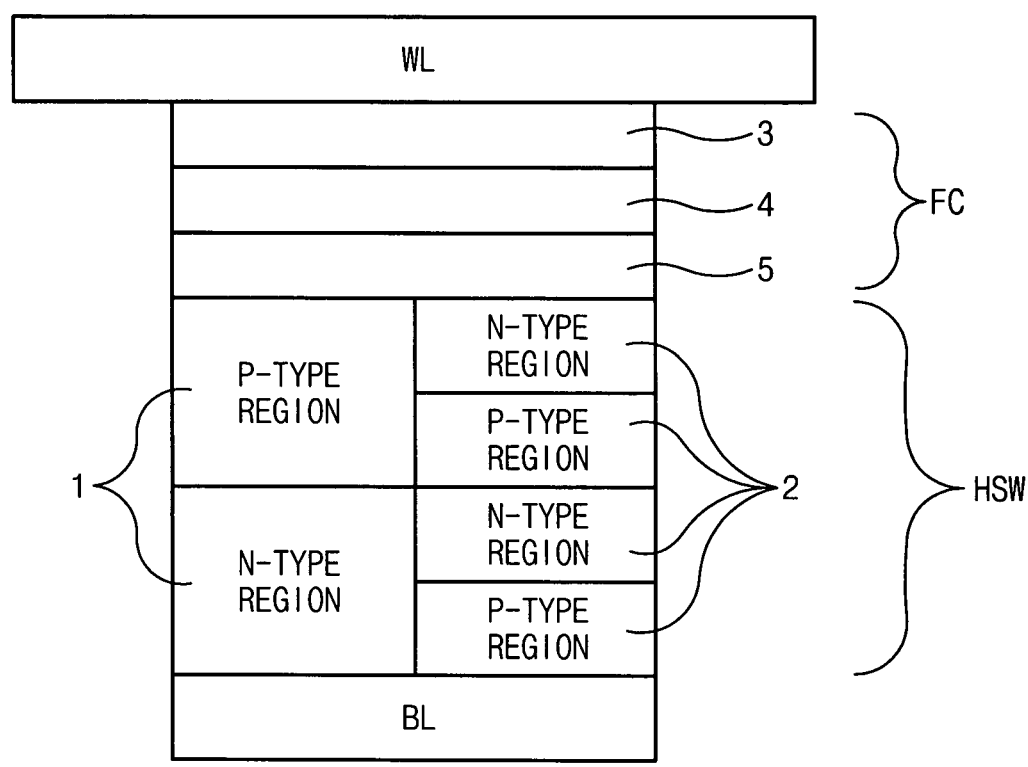
FIG. 3 is a cross-sectional diagram of the hybrid switch cell of FIG. 1.

FIG. 3 is a cross-sectional diagram of the hybrid switch cell of FIG. 1.

The hybrid switch HSW is deposited on the bit line BL of the hybrid switch cell. The nonvolatile ferroelectric capacitor FC is deposited on the hybrid switch HSW. Also, the word line WL is connected to the upper portion of the nonvolatile ferroelectric capacitor FC.

Here, the nonvolatile ferroelectric capacitor FC comprises a top electrode 3, a ferroelectric film 4 and a bottom electrode 5. The top electrode 3 is connected to the word line WL, and the bottom electrode 5 is connected to the P-type region of the PN diode switch 1 and the upper N-type region of the PNPN diode switch 2.

The bit line BL is connected to the N-type region of the PN diode switch 1 and the lower P-type region of the PNPN diode switch 2.

Figure 4:
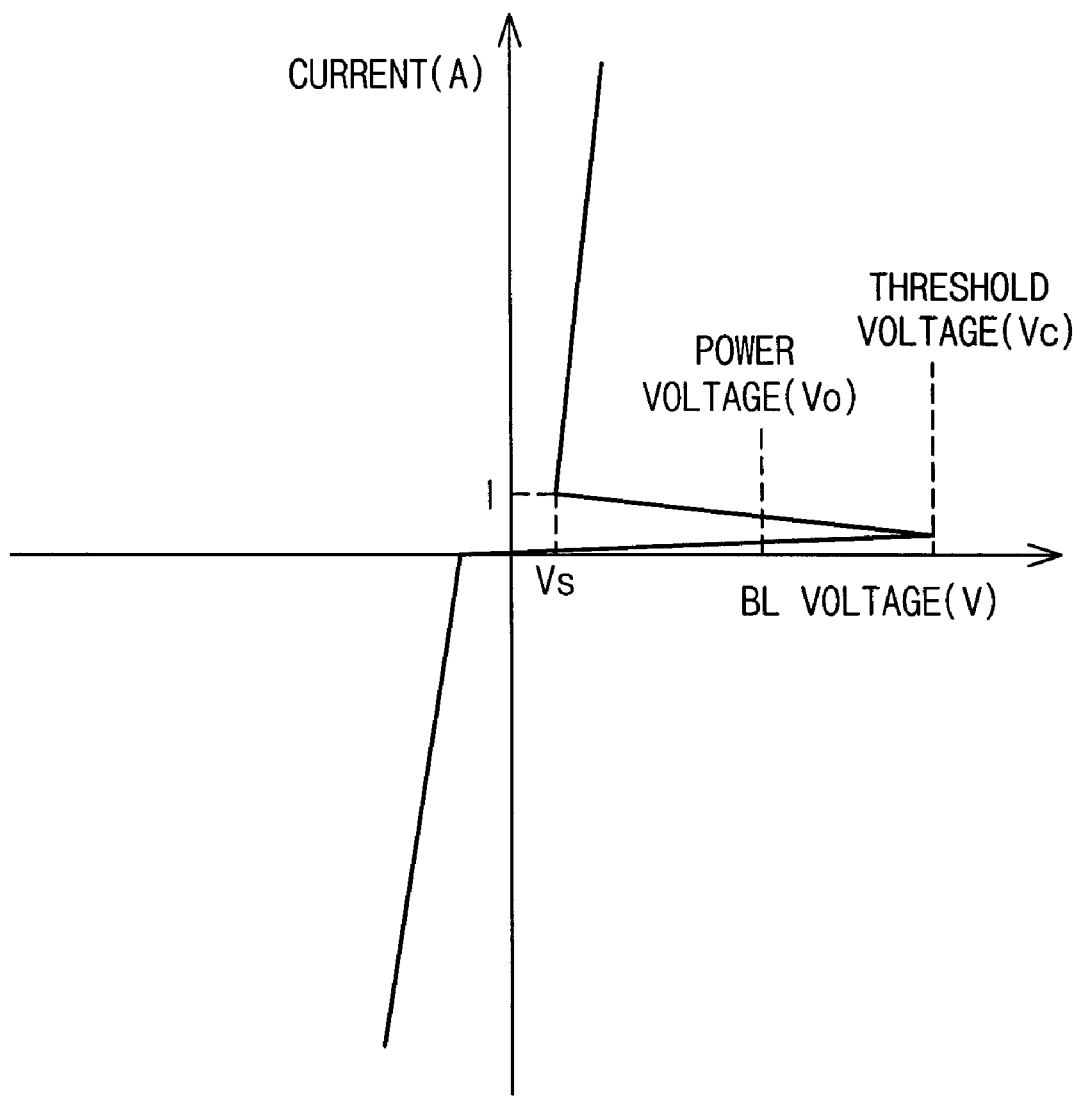
FIG. 4 is a graph illustrating the operation of the hybrid switch of FIG. 1.

FIG. 4 is a graph illustrating the operation of the hybrid switch HSW of FIG. 1.

Although a voltage applied to the nonvolatile ferroelectric capacitor FC increases toward a positive direction on the basis of the bit line BL and reaches a power voltage Vo, the hybrid switch HSW is kept off. As a result, current does not flow.

Thereafter, if the voltage applied to the bit line BL more increases and reaches a threshold voltage Vc, the PNPN diode switch 2 is turned on depending on the forward operation characteristic of the diode. As a result, as the hybrid switch HSW is turned on, the amount of current remarkably increases. Here, when the voltage applied to the bit line BL is over the threshold voltage Vc, a value of current I is affected by resistance (not shown) connected to the bit line BL to serve as load.

After the PNPN diode switch 2 is turned on, the large amount of current can flow although a small voltage Vs is applied to the bit line BL. Here, the PN diode switch 1 is kept off by the reverse operation characteristic.

On the other hand, if a predetermined voltage is applied to the nonvolatile ferroelectric capacitor FC increases toward a negative direction on the basis of the bit line BL, that is, a predetermined voltage is applied to the word line WL, the hybrid switch HSW is turned on by the forward operation characteristic of the PN diode switch 1. Then, current flows at a random operation voltage state. Here, the PNPN diode switch 1 is kept off by the reverse operation characteristic.

Figure 5A:
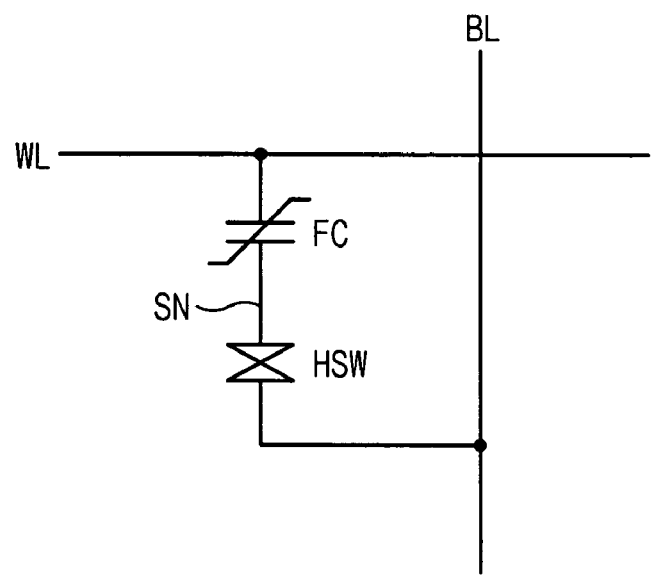
FIGS. 5a to 5c are a circuit diagram and graphs illustrating the word line/bit line voltage dependency of the hybrid switch cell according to an embodiment of the present invention.
Figure 5B:
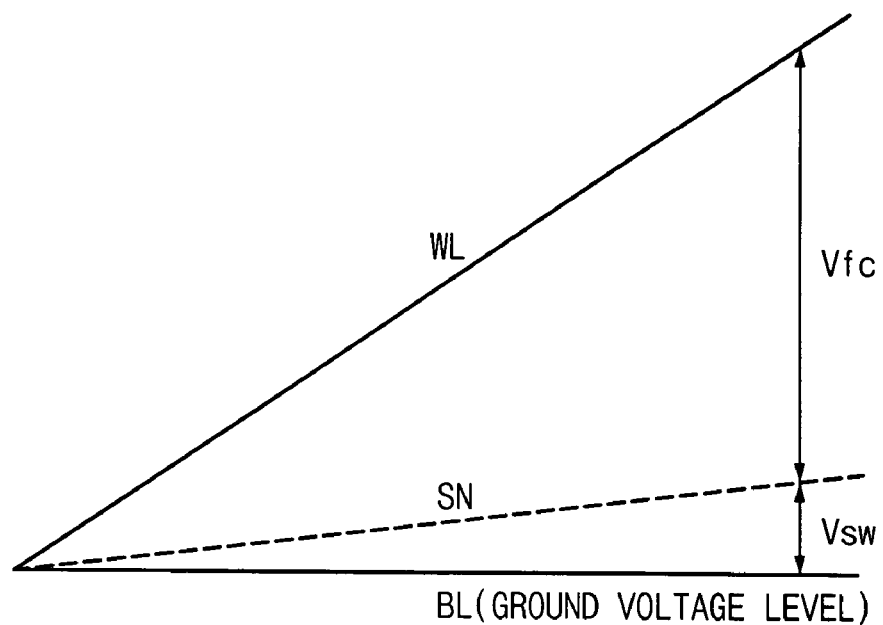
Figure 5C:
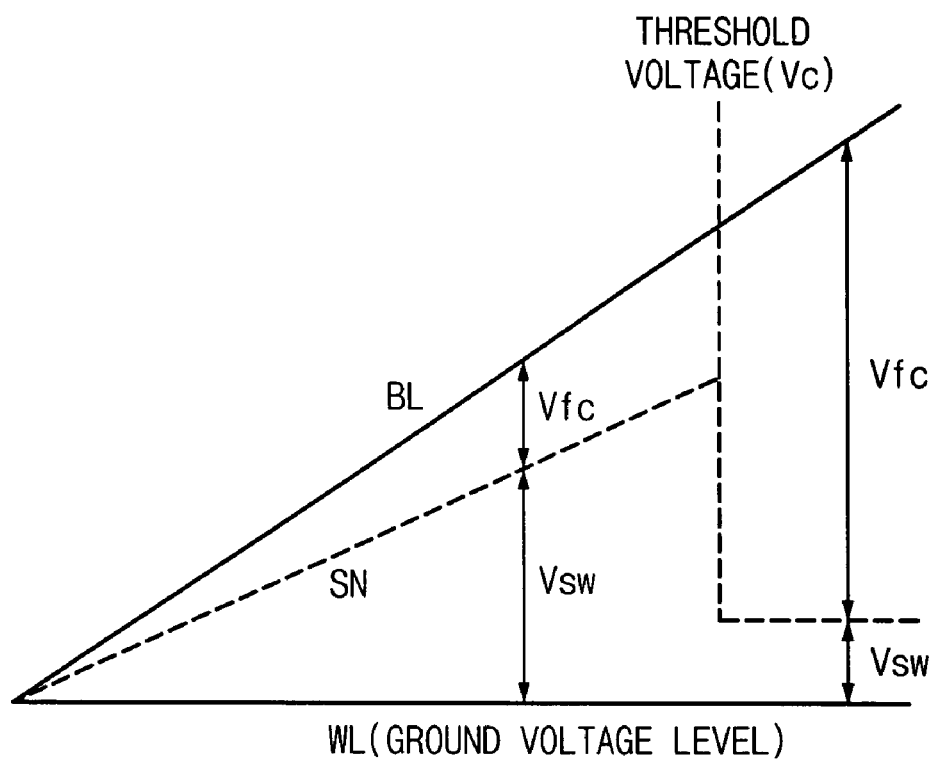

FIGS. 5a to 5c are a circuit diagram and graphs illustrating the word line/bit line voltage dependency of the hybrid switch cell according to an embodiment of the present invention.

Referring to FIG. 5a, Vfc refers to a voltage flowing the nonvolatile ferroelectric capacitor FC connected between the word line WL and a node SN, and Vsw refers to a voltage flowing in the hybrid switch HSW connected between the node SN and the bit line BL.

FIG. 5b is a diagram illustrating the word line WL voltage dependency of the hybrid switch cell according to an embodiment of the present invention.

If a voltage of the word line WL increases while a voltage of the bit line BL is fixed at a ground voltage level, the voltage of the word line WL is distributed to the nonvolatile ferroelectric capacitor FC and the hybrid switch HSW.

In other words, if the voltage of the word line WL increases while the voltage of the bit line BL is at the ground level, the PN diode switch 1 of the hybrid switch HSW is turned on at a small voltage. As a result, current flows.

Here, the small voltage Vsw is distributed by the forward operation characteristic of the PN diode switch 1 in the hybrid switch HSW. On the other hand, the voltage of the word line WL is distributed as the large voltage Vfc to the nonvolatile ferroelectric capacitor FC. Therefore, the operation characteristics by the voltage of the word line WL are improved.

FIG. 5c is a diagram illustrating the bit line BL voltage dependency of the hybrid switch cell according to an embodiment of the present invention.

If a voltage of the bit line BL increases while a voltage of the word line WL is fixed at a ground voltage level, the voltage of the bit line BL is distributed to the nonvolatile ferroelectric capacitor FC and the hybrid switch HSW.

In other words, if the voltage of the bit line BL increases while the voltage of the word line WL is fixed at the ground voltage level, the PNPN diode switch 2 of the hybrid switch HSW is kept off until the voltage of the bit line BL reaches a threshold voltage Vc. The PN diode switch 1 of the hybrid switch HSW is kept off by the reverse operation characteristic of the PN diode switch 1. As a result, most voltage of the bit line BL is distributed as the large voltage Vsw to the hybrid switch HSW.

On the other hand, when the hybrid switch HSW is turned off, the voltage of the bit line BL is distributed as the small voltage Vfc to the nonvolatile ferroelectric capacitor FC. As a result, data stored in the nonvolatile ferroelectric capacitor FC are not changed.

Thereafter, when the voltage of the bit line BL rises to reach over the threshold voltage Vc, the PNPN diode switch 2 of the hybrid switch HSW is turned on, and most voltage of the bit line BL is distributed to the nonvolatile ferroelectric capacitor FC, and the voltage Vfc increases. As a result, new data are written in the nonvolatile ferroelectric capacitor FC of the hybrid switch cell.

Figure 6:
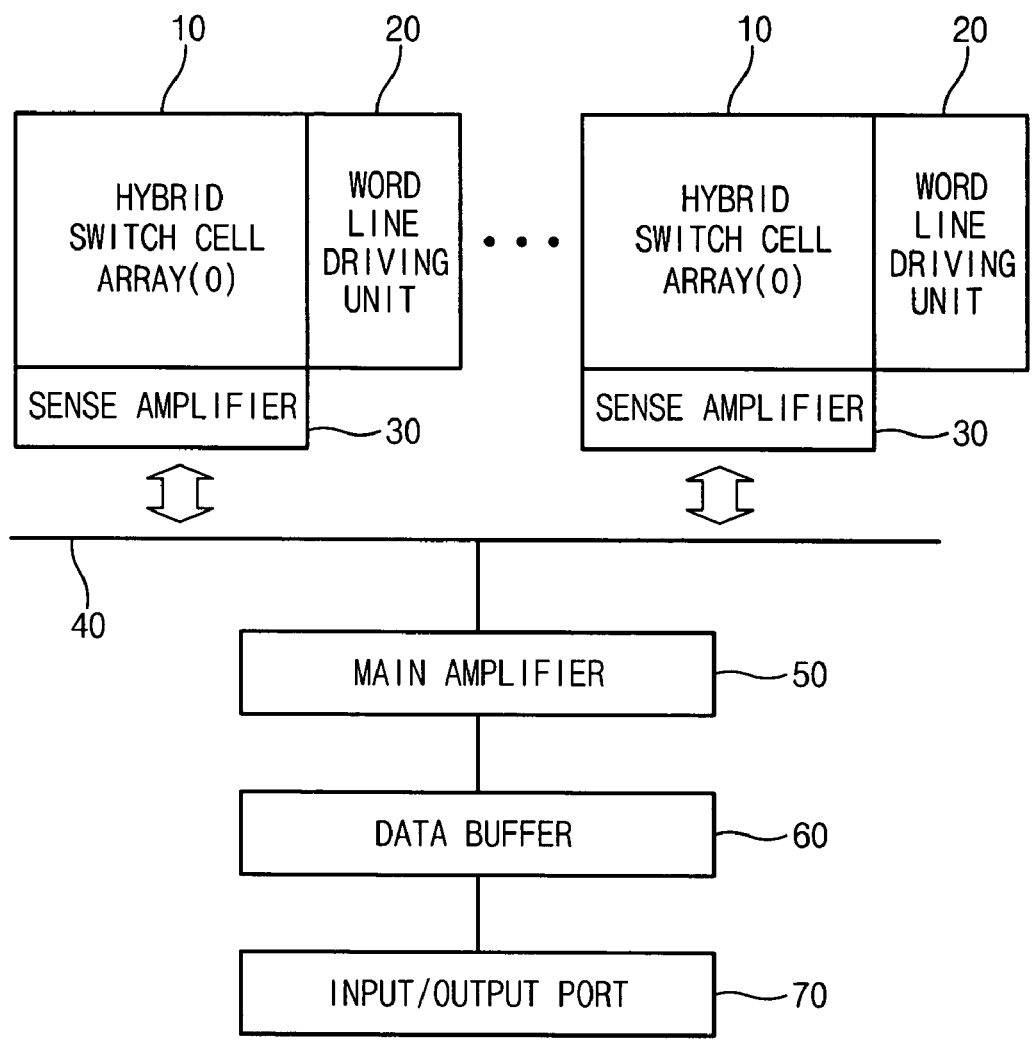
FIG. 6 is a block diagram of a memory device using a hybrid switch cell according to an embodiment of the present invention.

FIG. 6 is a block diagram of a memory device using a hybrid switch cell according to an embodiment of the present invention.

In an embodiment, the memory device comprises a plurality of hybrid switch cell arrays 10, a plurality of word line driving units 20, a plurality of sense amplifiers 30, a data bus 40, a main amplifier 50, a data buffer 60 and an input/output port 70.

Each hybrid switch cell array 10 comprises a plurality of hybrid switch cells arranged in row and column directions as described in FIG. 1. A plurality of word lines WL arranged in the row direction are connected to the word line driving unit 20. A plurality of bit lines BL arranged in the column direction are connected to the sense amplifier 30.

Here, one hybrid switch cell array 10 is correspondingly connected to one word line driving unit 20 and one sense amplifier 30.

The plurality of sense amplifiers 30 share one data bus 40. The data bus 40 is connected to the main amplifier 50 which amplifies data applied to the data bus 40.

The data buffer 60 buffers the amplified data applied to the main amplifier 50. The input/output port 70 outputs output data applied from the data buffer 60 to the outside or applies input data applied from the outside to the data buffer 60.

Figure 7:
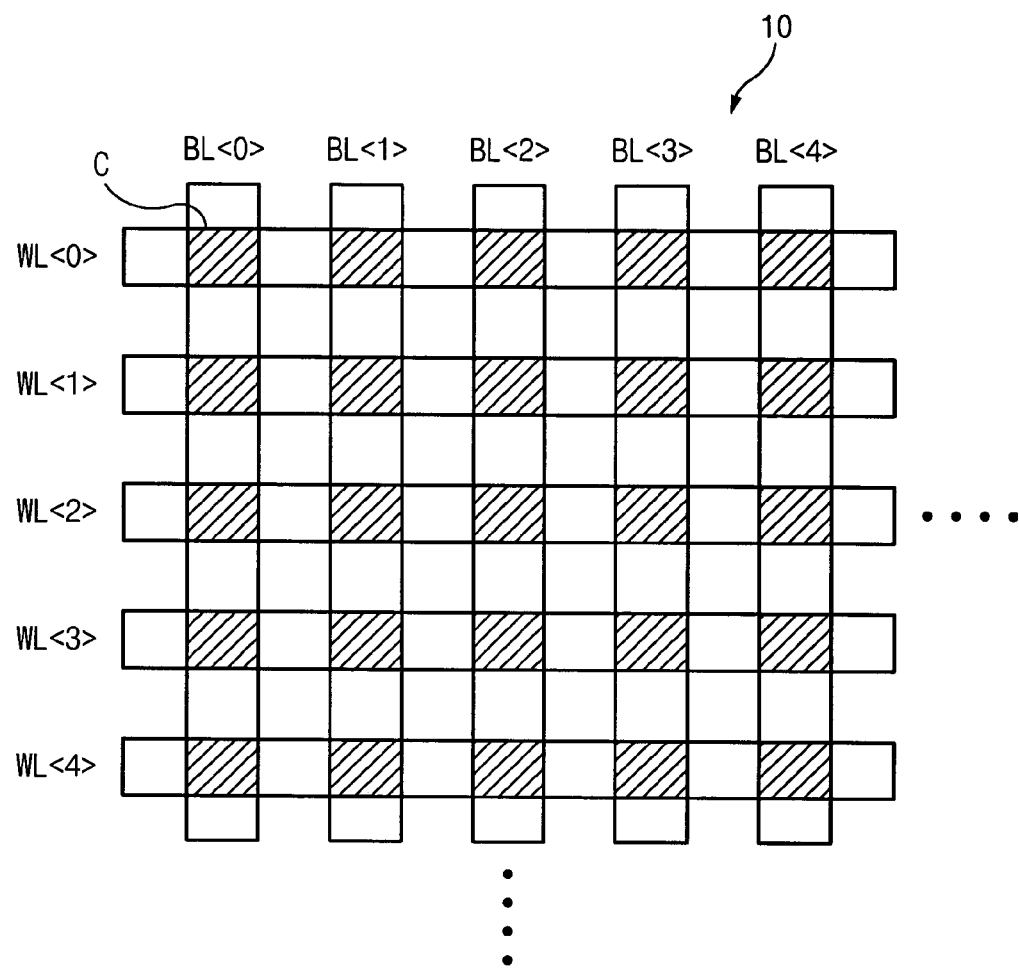
FIG. 7 is a layout diagram of a hybrid switch cell array of FIG. 6.

FIG. 7 is a layout diagram of the hybrid switch cell array 10 of FIG. 6.

The hybrid switch cell array 10 comprises a plurality of word lines WL arranged in the row direction and a plurality of bit lines BL arranged in the column direction. A unit cell C is located only where the word line WL and the bit line BL are crossed. That is, a cross-point cell is embodied. Since it is unnecessary to form devices in other regions, a cell can be formed in a space necessary to form the word line WL and the bit line BL without requiring an additional area.

Here, the cross-point cell refers to a hybrid switch cell using the hybrid switch HSW comprising a nonvolatile ferroelectric capacitor FC located where a bit line BL and a word line WL are crossed. The hybrid switch cell does not comprise a NMOS transistor using an additional word line WL or gate control signal but comprises two connection electrode node.

Figure 8:
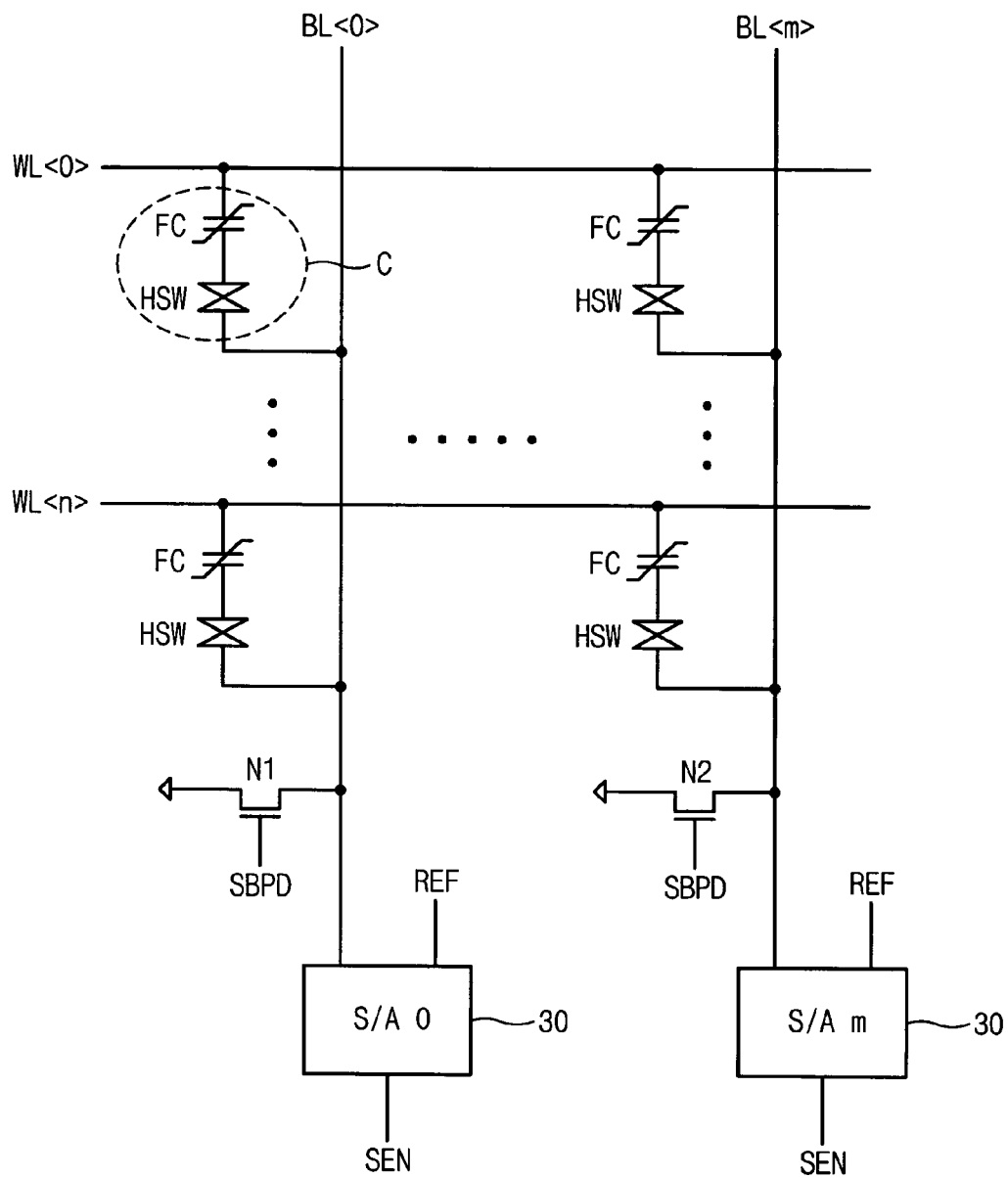
FIG. 8 is a circuit diagram of a hybrid switch cell array of FIG. 6.

FIG. 8 is a circuit diagram of the hybrid switch cell array 10 of FIG. 6.

The hybrid switch cell array 10 comprises a plurality of word lines WL<0>~WL<n> arranged in the row direction and a plurality of bit lines BL<0>~BL<m> arranged in the column direction. A unit cell C is located only where the word line WL and the bit line BL are crossed. Here, the unit cell C comprises one nonvolatile ferroelectric capacitor FC and one hybrid switch HSW.

The plurality of sense amplifiers 30 are connected one by one to the bit lines BL. Each sense amplifier 30 compares a voltage applied from the bit line BL with a reference voltage REF previously set when a sense amplifier enable signal SEN is activated, and amplifies the comparison result.

A bit line pull-down device N1 is connected to the bit line BL<0>, and a bit line pull-down device N2 is connected to the bit line BL<m>. When a bit line pull-down signal SBPD is activated, a ground voltage is applied to the bit line BL and pull down the bit line BL to a ground level.

The above-described hybrid switch cell array 10 is operated so that each nonvolatile ferroelectric capacitor FC may store one data.

Figure 9:
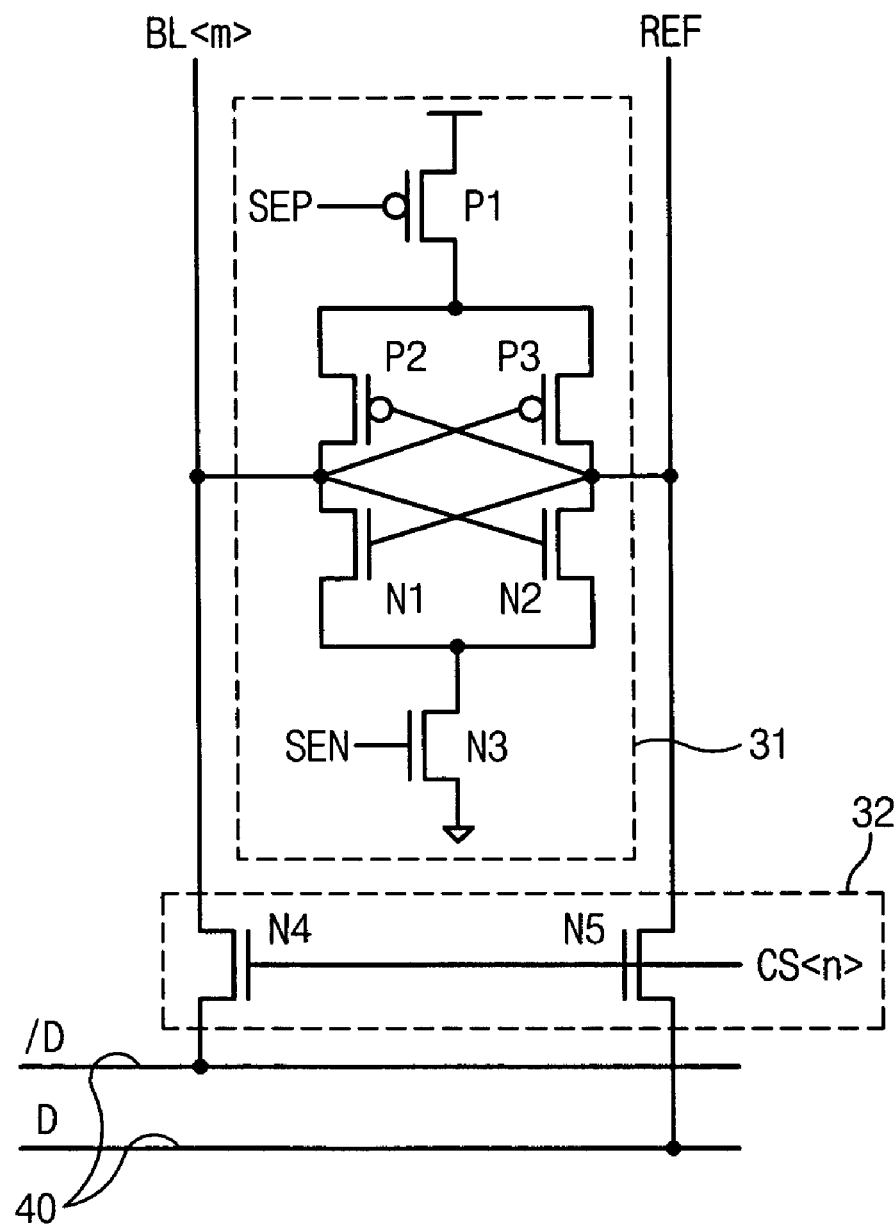
FIG. 9 is a circuit diagram of a sense amplifier of FIG. 8.

FIG. 9 is a circuit diagram of the sense amplifier 30 of FIG. 8.

The sense amplifier 30 comprises an amplifying unit 31 and a column selecting switching unit 32.

Here, the amplification unit 31 comprises PMOS transistors P1~P3 and NMOS transistors N1~N3. The PMOS transistor P1, connected between a power voltage terminal and a common source terminal of the PMOS transistors P2 and P3, has a gate to receive a sense amplifier enable signal SEP. The cross-coupled PMOS transistors P2 and P3 latch a power voltage applied through the PMOS transistor P1.

A NMOS transistor N3, connected between a ground voltage terminal and a common source terminal of NMOS transistors N1 and N2, has a gate to receive a sense amplifier enable signal SEN. The cross-coupled NMOS transistors N1 and N2 latch a ground voltage applied through the NMOS transistor N3.

Here, the sense amplifier enable signal SEN has a phase opposite to that of the sense amplifier enable signal SEP. When the sense amplifier enable signal SEN is activated, the amplification unit 31 is operated. One output terminal of the amplification unit 31 is connected to the bit line BL<m>, and the other output terminal of the amplification unit 31 is connected to a terminal to receive a reference voltage REF.

The column selecting switching unit 32 comprises NMOS transistors N4 and N5. The NMOS transistor N4, connected between the bit line BL<m> and the data bus 40, has a gate to receive a column selecting signal CS<n>, thereby controlling input/output of the data /D. The NMOS transistor N5, connected to the terminal to receive the reference voltage REF and the data bus 40, has a gate to receive the column selecting signal CS<n>, thereby controlling input/output of the data D.

Figure 10:
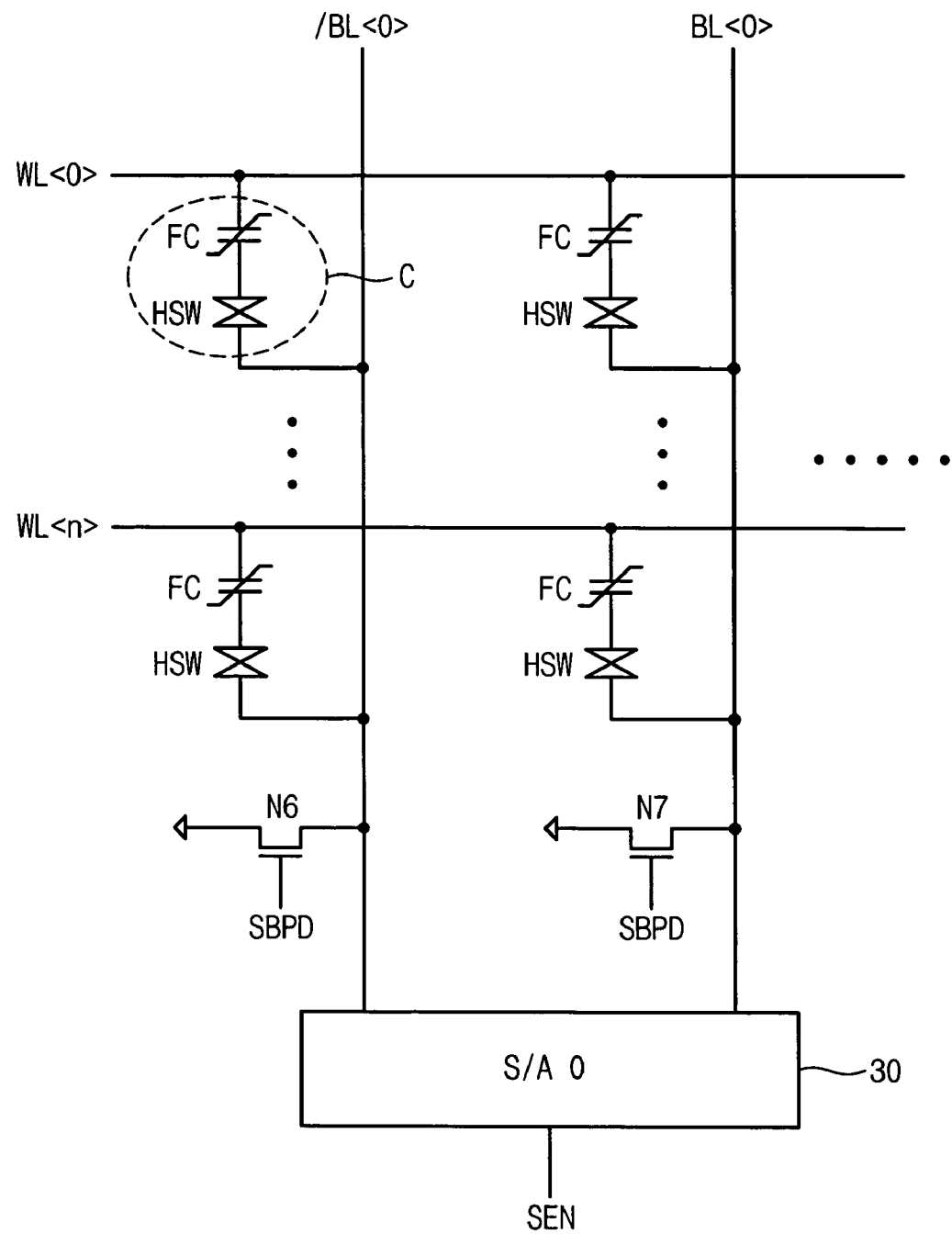
FIG. 10 is a circuit diagram illustrating another example of the hybrid switch cell array of FIG. 6.

FIG. 10 is a circuit diagram illustrating another example of the hybrid switch cell array 10 of FIG. 6.

The hybrid switch cell array 10 comprises a plurality of word lines WL<0>~WL<n> arranged in the row direction and a plurality of paired bit lines BL and /BL arranged in the column direction. A unit cell C is located only where the paired bit lines BL and /BL are crossed. The unit cell C comprises one nonvolatile ferroelectric capacitor FC and one hybrid switch HSW.

One sense amplifier 30 is connected one by one to the paired bit lines BL and /BL. When a sense amplifier enable signal SEN is activated, each sense amplifier 30 is simultaneously operated to amplify data applied from the paired bit lines BL and /BL.

A bit line pull-down device N6 is connected to the bit line /BL<0>, and a bit line pull-down device N7 is connected to the bit line BL<0>. As a result, when a bit line pull-down signal SBPD is activated, the bit line pull-down devices N6 and N7 apply a ground voltage to the paired bit lines BL and /BL, and pull down the paired bit lines BL and /BL to a ground voltage level.

The above-described hybrid switch cell array 10 is operated so that two nonvolatile ferroelectric capacitors FC may store one data.

Figure 11:
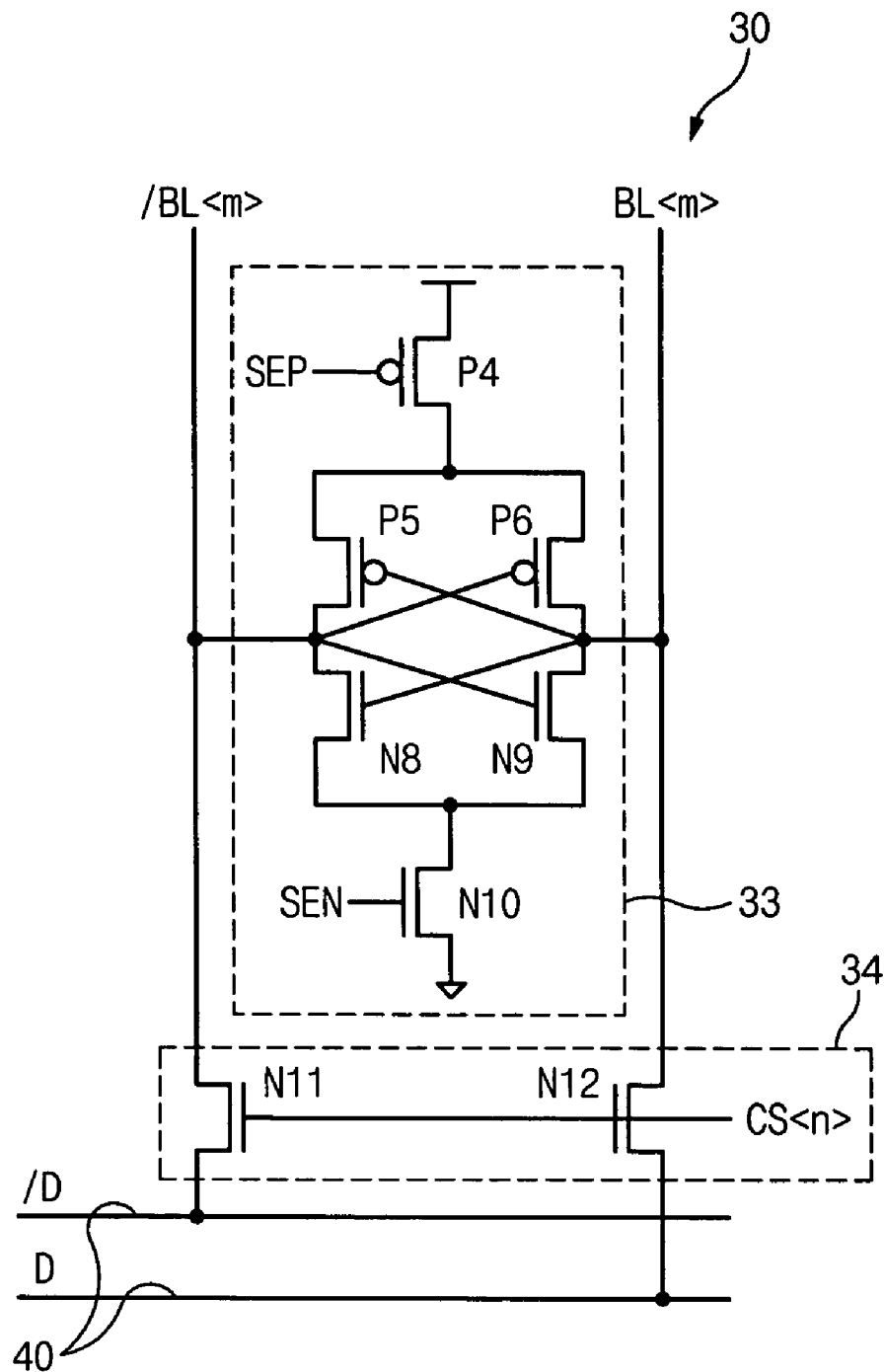
FIG. 11 is a circuit diagram of the sense amplifier of FIG. 10.

FIG. 11 is a circuit diagram of the sense amplifier 30 of FIG. 10.

The sense amplifier 30 comprises an amplifying unit 33 and a column selecting switching unit 34.

Here, the amplification unit 33 comprises PMOS transistors P4~P6 and NMOS transistors N8~N10. The PMOS transistor P4, connected between a power voltage terminal and a common source terminal of the PMOS transistors P5 and P6, has a gate to receive a sense amplifier enable signal SEP. The cross-coupled PMOS transistors P5 and P6 latch a power voltage applied through the PMOS transistor P4.

A NMOS transistor N10, connected between a ground voltage terminal and a common source terminal of NMOS transistors N8 and N9, has a gate to receive a sense amplifier enable signal SEN. The cross-coupled NMOS transistors N8 and N9 latch a ground voltage applied through the NMOS transistor N10.

Here, the sense amplifier enable signal SEN has a phase opposite to that of the sense amplifier enable signal SEP. When the sense amplifier enable signal SEN is activated, the amplification unit 33 is operated. One output terminal of the amplification unit 33 is connected to the bit line BL<m>, and the other output terminal of the amplification unit 33 is connected to a terminal to receive a reference voltage REF.

The column selecting switching unit 34 comprises NMOS transistors N11 and N12. The NMOS transistor N11, connected between the bit line BL<m> and the data bus 40, has a gate to receive a column selecting signal CS<n>, thereby controlling input/output of the data /D. The NMOS transistor N12, connected to the terminal to receive the reference voltage REF and the data bus 40, has a gate to receive the column selecting signal CS<n>, thereby controlling input/output of the data D.

Figure 12:
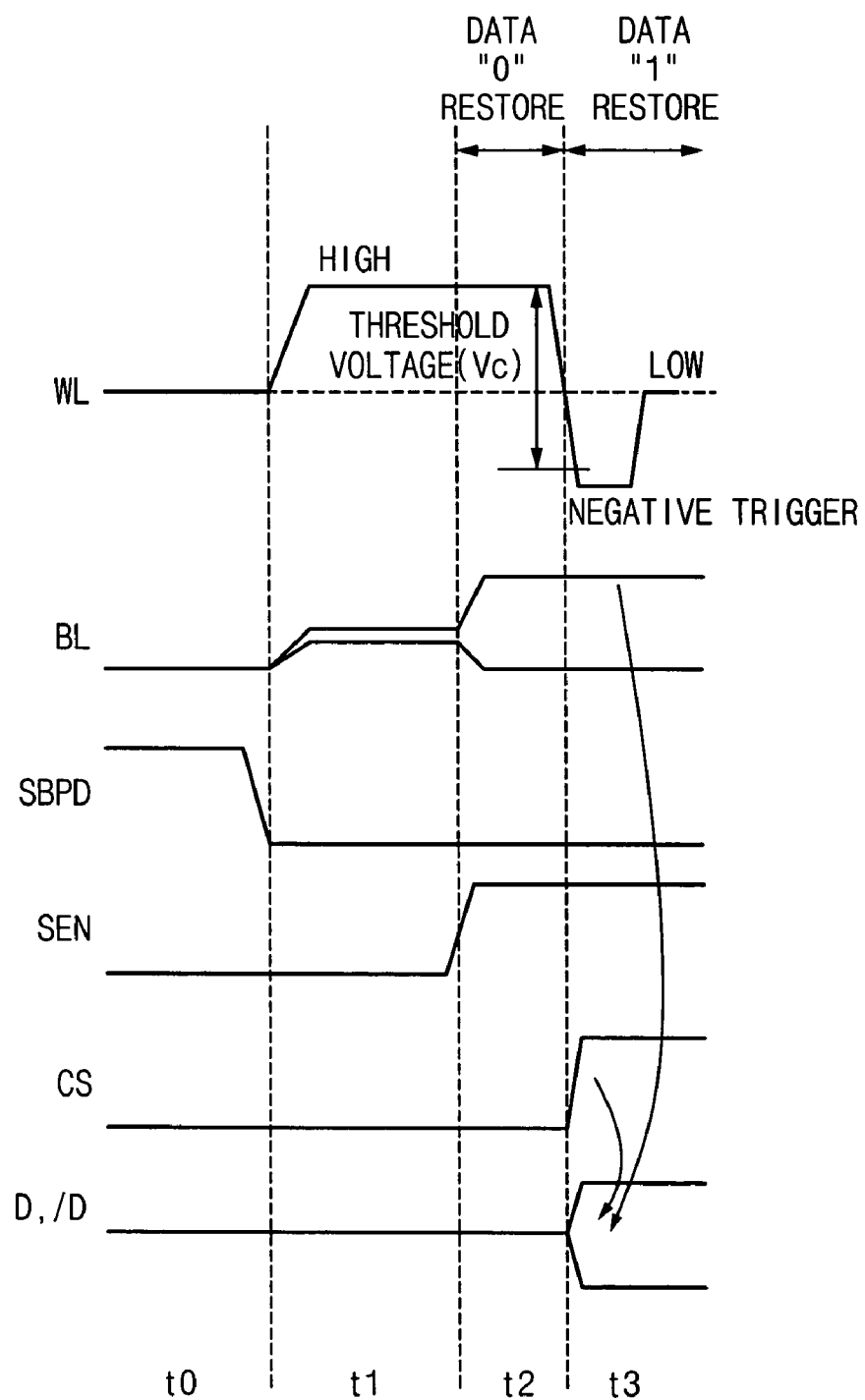
FIG. 12 is a timing diagram illustrating the read mode of the nonvolatile memory device using a hybrid switch cell according to an embodiment of the present invention.

FIG. 12 is a timing diagram illustrating the read mode of the nonvolatile memory device using a hybrid switch cell according to an embodiment of the present invention.

In an interval t0, the bit line pull-down signal SBPD is activated, and the ground voltage is applied to the paired bit lines BL. As a result, the bit line BL is precharged to the ground level.

When an interval t1 starts, if the word line WL transits to 'high' and a predetermined voltage is applied to the word line WL, the PN diode 1 of the hybrid switch HSW is turned on. As a result, data of the hybrid switch cell are transmitted to the bit line BL. Here, the bit line pull-down signal SBPD transits to 'low'.

Next, in an interval t2, if the sense amplifier enable signal transits to 'high', the sense amplifier 30 amplifies data applied from the bit line BL. If the voltage of the bit line BL is amplified to the low level while the voltage of the word line WL is 'high', data "0" is restored in the hybrid switch cell C.

Thereafter, in an interval t3, the voltage of the word line WL transits to a negative voltage which is less than the threshold voltage Vc. That is, a difference between the low voltage level of the bit line BL and the negative voltage level of the word line WL does not reach the level of the threshold voltage Vc to turn on the PNPN diode switch 2 of the hybrid switch HSW.

However, a voltage higher than the threshold voltage Vc is applied to turn on the PNPN diode switch 2 depending on the difference between the low voltage level of the bit line BL and the negative voltage level of the word line WL. As a result, the PNPN diode switch 2 is turned on, and data "1" are restored in the hybrid switch cell.

After the PNPN diode switch 2 is turned on, a large amount of current can flow although the small voltage Vs is applied to the bit line BL. As a result, the sufficient amount of current can flow although the voltage of the word line WL rises from the negative voltage to the low level in the interval t3.

In the interval t3, if the column selecting signal transits to 'high', the NMOS transistors N11 and N12 of the column selecting switching unit 34 are turned on, and the data D and /D in the bit line BL are outputted to the data bus 40. As a result, data stored in the hybrid switch cell C can be read.

Figure 13:
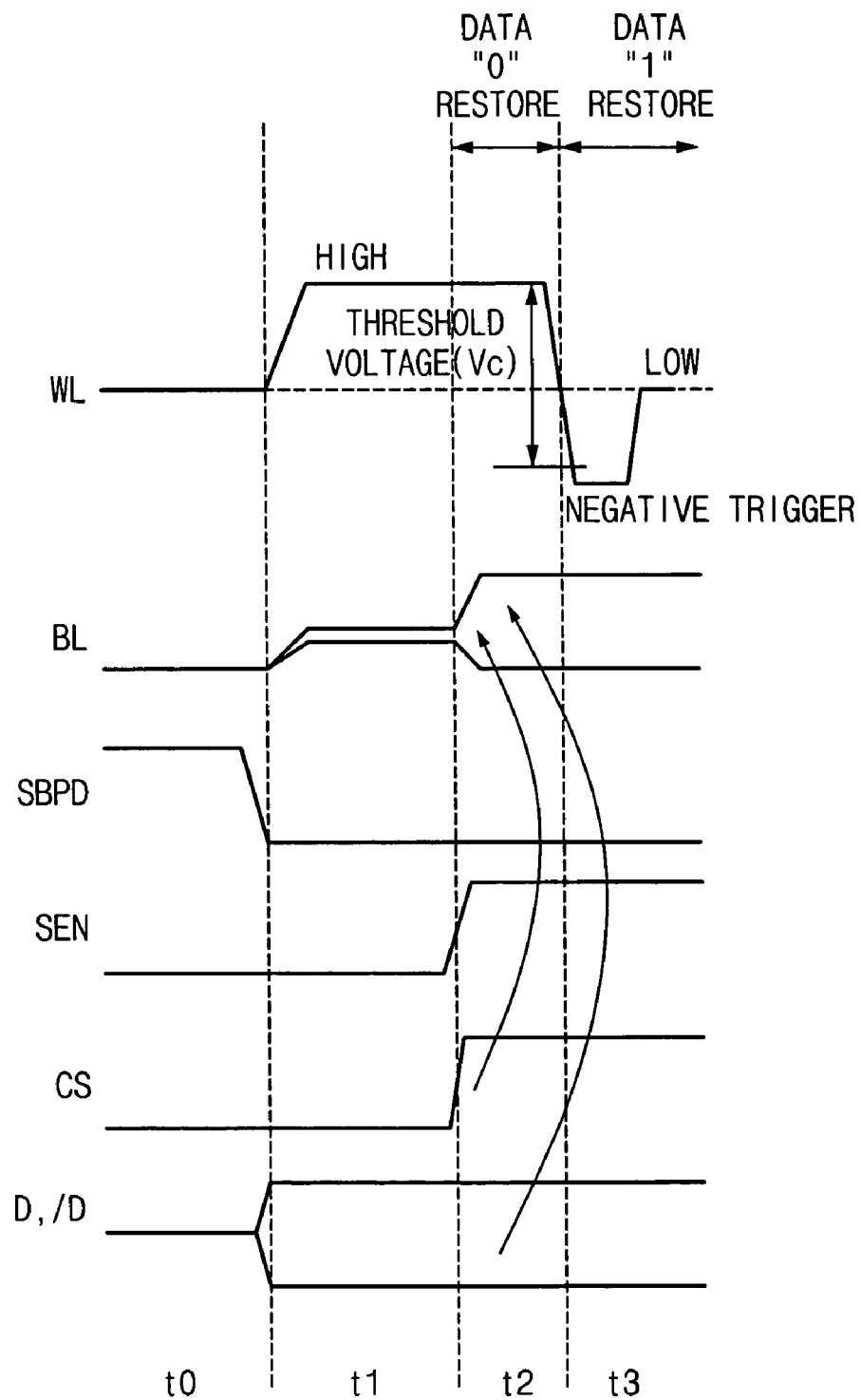
FIG. 13 is a timing diagram illustrating the write mode of the nonvolatile memory device using a hybrid switch cell according to an embodiment of the present invention.

FIG. 13 is a timing diagram illustrating the write mode of the nonvolatile memory device using a hybrid switch cell according to an embodiment of the present invention.

In an interval t0, the bit line pull-down signal SBPD is activated, and the ground voltage is applied to the paired bit lines BL. As a result, the bit line BL is pulled down to the ground level.

Thereafter, when an interval t1 starts, if the voltage of the word line WL transits to 'high', data of the hybrid switch cell are transmitted to the bit line BL. Here, the bit line pull-down signal SBPD transits to 'low'. Then, new data D and /D to be written through the data bus 40 are inputted to the bit line BL.

Next, in an interval t2, the sense amplifier enable signal SEN is activated, and the sense amplifier 30 amplifies data in the bit line BL. If the voltage of the bit line BL is amplified to the low level while the voltage of the word line is 'high', data "0" are written in the hybrid switch cell C.

Here, if the column selecting signal CS transits to 'high', the NMOS transistors N11 and N12 of the column selecting switching unit 34 are turned on. As a result, the data D and /D inputted through the data bus 40 are applied to the bit line BL.

Thereafter, in an interval t3, the voltage of the word line WL transits to the negative voltage. That is, a difference between the low voltage level of the bit line BL and the negative voltage level of the word line WL does not read the level of the threshold voltage Vc to turn on the PNPN diode switch 2 of the hybrid switch HSW.

However, a voltage higher than the threshold voltage Vc to turn on the PNPN diode switch 2 is applied depending on the high level voltage of the bit line BL and the negative voltage level of the word line WL. As a result, the PNPN diode switch 2 is turned on, and data "1" are written in the hybrid switch cell.

Although a nonvolatile ferroelectric memory device is described as an example of a memory device to store data herein, the present invention is not limited to the particular form disclosed. Rather, the memory device according to an embodiment of the present invention can include a DRAM device or a flash device.

As discussed earlier, a memory device using a hybrid switch cell according to an embodiment of the present invention provides the following effects: to embody a cross-point cell with a nonvolatile ferroelectric capacitor and a hybrid switch, thereby reducing the whole size of the memory; and to effectively drive read/write operations in a cell array using the hybrid switch, thereby improving operating characteristics of the memory cell.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A hybrid switch cell comprising:
    a nonvolatile ferroelectric capacitor, connected to a word line, for storing a logic data value; and
    a hybrid switch connected between the nonvolatile ferroelectric capacitor and a bit line and selectively switched depending on voltages applied to the word line and the bit line wherein the hybrid switch comprises a first switching unit for reading data of the nonvolatile ferroelectric capacitor when a first voltage having over a predetermined level is applied to the word line and a second switching unit for writing data in the nonvolatile ferroelectric capacitor when a second voltage higher than the first voltage is applied to the bit line.

2. The hybrid switch cell according to claim 1, wherein the hybrid switch cell has a sequentially deposited structure of the bit line, the hybrid switch, the nonvolatile ferroelectric capacitor and the word line, and
    the nonvolatile ferroelectric capacitor and the hybrid switch are formed where the word line and the bit line are crossed.

3. The hybrid switch cell according to claim 1, wherein the bit line, the hybrid switch, the nonvolatile ferroelectric capacitor and the word line are sequentially deposited,
    the top of the first switching unit and the second switching unit is contacted with the nonvolatile ferroelectric capacitor, and the bottom of the first switching unit and the second switching unit is contacted with the bit line, each of the first switching unit and the second switching unit comprises at least one or more PN diodes formed vertically, and the second switching unit is configured to have more deposited PN diodes than the first switching unit.

4. The hybrid switch cell according to claim 3, wherein the hybrid switch comprises the first switching unit including a PN diode and the second switching unit including PNPN diodes.

5. The hybrid switch cell according to claim 4, wherein the PN diode switch is connected in a forward direction and the PNPN diode switch is connected in a reverse direction to the nonvolatile ferroelectric capacitor.

6. The hybrid switch cell according to claim 4, wherein the hybrid switch reads cell data of the nonvolatile ferroelectric capacitor to the bit line if a high level voltage is applied to the word line to turn on the PN diode, and the hybrid switch writes data of the bit line to the nonvolatile ferroelectric capacitor if a negative trigger voltage is applied to the word line to turn on the PNPN diodes.

7. The hybrid switch cell according to claim 6, wherein after the negative trigger voltage is applied, a voltage level of the bit line drops step by step when data of the bit line are at a high level, and a voltage level of the bit line is constantly maintained when data of the bit line is at a low level.

8. A memory device using a hybrid switch cell, comprising:

a plurality of hybrid switch cell arrays each comprising a plurality of hybrid switch cells each located where a word line and a bit line are crossed;

a plurality of word line driving units for selectively driving the word line; and a plurality of sense amplifiers for sensing and amplifying data transmitted through the bit line, wherein each of the hybrid switch cell arrays comprises:

a nonvolatile ferroelectric capacitor, connected to a word line, for storing a logic data; and a hybrid switch connected between the nonvolatile ferroelectric capacitor and a bit line and selectively switched depending on voltages applied to the word line and the bit line.

9. The memory device according to claim 8, wherein the hybrid switch cell has a sequentially deposited structure of the bit line, the hybrid switch, the nonvolatile ferroelectric capacitor and the word line, and the nonvolatile ferroelectric capacitor and the hybrid switch are formed where the word line and the bit line are crossed.

10. The memory device according to claim 8, wherein the hybrid switch comprises:

a first switching unit for reading data of the nonvolatile ferroelectric capacitor if a first voltage having over a predetermined level is applied to the word line; and a second switching unit for writing data in the nonvolatile ferroelectric capacitor if a second voltage higher than the first voltage is applied to the bit line.

11. The memory device according to claim 10, wherein the bit line, the hybrid switch, the nonvolatile ferroelectric capacitor and the word line are sequentially deposited, the top of the first switching unit and the second switching unit is contacted with the nonvolatile ferroelectric capacitor, and the bottom of the first switching unit and the second switching unit is contacted with the bit line, each of the first switching unit and the second switching unit comprises at least one or more PN diodes formed vertically, and the second switching unit is configured to have more deposited PN diodes than the first switching unit.

12. The memory device according to claim 11, wherein the hybrid switch comprises the first switching unit including a PN diode and the second switching unit including PNPN diodes.

13. The memory device according to claim 12, wherein the PN diode switch is connected in a forward direction and the PNPN diode switch is connected in a reverse direction to the nonvolatile ferroelectric capacitor.

14. The memory device according to claim 12, wherein the hybrid switch reads cell data of the nonvolatile ferroelectric capacitor to the bit line if a high level voltage is applied to the word line to turn on the PN diode, and the hybrid switch writes data of the bit line to the nonvolatile ferroelectric capacitor if a negative trigger voltage is applied to the word line to turn on the PNPN diodes.

15. The memory device according to claim 14, wherein after the negative trigger voltage is applied, a voltage level of the bit line drops step by step when data of the bit line are at a high level, and a voltage level of the bit line is constantly maintained when data of the bit line is at a low level.

16. The memory device according to claim 8, further comprising:

a data bus shared by the plurality of sense amplifiers;

a main amplifier for amplifying data of the data bus;

a data buffer for buffering data inputted/outputted in the main amplifier; and an input/output port, connected to the data buffer, and for inputting/outputting data.

17. The memory device according to claim 8, wherein each of the plurality of hybrid switch cell arrays further comprises a plurality of bit line pull-down devices connected one by one to the plurality of bit lines.

18. The memory device according to claim 8, wherein the plurality of sense amplifiers, connected one by one to the plurality of bit lines, compare and amplify voltages of the bit lines with reference voltages when a sense amplifier enable signal is activated.

19. The memory device according to claim 8, wherein each of the plurality of hybrid switch cell arrays comprises a pair of a bit line and a bit line bar, and bit line pull-down devices corresponding to the bit line and the bit line bar, respectively.

20. The memory device according to claim 19, wherein each of the plurality of sense amplifiers is configured to correspond to the pair of the bit lines, and to amplify a voltage applied from the pair of the bit lines.

* * * * *